United States Patent
Wang

(10) Patent No.: US 9,070,839 B2
(45) Date of Patent: Jun. 30, 2015

(54) METHOD OF MANUFACTURING A LIGHT EMITTING DIODE

(75) Inventor: Tao Wang, Bents Green (GB)

(73) Assignee: Seren Photonics Limited, Bridgend (GB)

( * ) Notice: Subject to any disclaimer, the term of this patent is extended or adjusted under 35 U.S.C. 154(b) by 0 days.

(21) Appl. No.: 13/984,348

(22) PCT Filed: Feb. 8, 2012

(86) PCT No.: PCT/GB2012/050275
§ 371 (c)(1),
(2), (4) Date: Oct. 24, 2013

(87) PCT Pub. No.: WO2012/107759
PCT Pub. Date: Aug. 16, 2012

(65) Prior Publication Data
US 2014/0038320 A1    Feb. 6, 2014

(30) Foreign Application Priority Data
Feb. 8, 2011    (GB) .................................. 1102122.7

(51) Int. Cl.
| H01L 21/00 | (2006.01) |
| H01L 27/15 | (2006.01) |
| H01L 33/44 | (2010.01) |
| B82Y 20/00 | (2011.01) |
| H01L 33/18 | (2010.01) |
| H01L 33/00 | (2010.01) |

(Continued)

(52) U.S. Cl.
CPC ................. *H01L 33/44* (2013.01); *B82Y 20/00* (2013.01); *H01L 33/005* (2013.01); *H01L 33/08* (2013.01); *H01L 33/18* (2013.01); *H01L 33/42* (2013.01); *H01L 33/0062* (2013.01)

(58) Field of Classification Search
CPC ..... H01L 33/44; H01L 33/18; H01L 33/0062; H01L 33/42; H01L 33/08; H01L 33/005; B82Y 20/00
USPC .......... 438/22, 24–26, 29, 46; 257/79–85, 94, 257/98
See application file for complete search history.

(56) References Cited

U.S. PATENT DOCUMENTS

| 5,429,954 A | 7/1995 | Gerner |
| 6,197,609 B1 | 3/2001 | Tsutsui et al. |

(Continued)

FOREIGN PATENT DOCUMENTS

| EP | 1768196 A2 | 3/2007 |
| EP | 1855327 A2 | 11/2007 |

(Continued)

*Primary Examiner* — Hsien Ming Lee
(74) *Attorney, Agent, or Firm* — Fraser Clemens Martin & Miller LLC; William J. Clemens

(57) ABSTRACT

A method (100) of making a semiconductor device, for example a light emitting diode. The method (100) includes providing (105) a semiconductor wafer, and providing (110) a protective layer over the semiconductor wafer. Preferably the protective layer comprises indium-tin oxide. Processing steps are performed on the wafer and the protective layer is arranged to protect the wafer during the processing steps. The processing steps may include forming a mask layer (115) over the protective layer, which is used for etching through the protective layer and into the semiconductor wafer, removing the mask layer, or etching filling materials (150) provided over the selectively etched semiconductor wafer.

14 Claims, 6 Drawing Sheets

(51) Int. Cl.
  *H01L 33/08* (2010.01)
  *H01L 33/42* (2010.01)

(56) References Cited

U.S. PATENT DOCUMENTS

| 8,183,576 B2 * | 5/2012 | Min et al. ..................... 257/79 |
| 2005/0211993 A1 | 9/2005 | Sano et al. |
| 2007/0001178 A1 | 1/2007 | Tran et al. |
| 2007/0126013 A1 | 6/2007 | Kim et al. |
| 2007/0200122 A1 | 8/2007 | Kim et al. |
| 2009/0020772 A1 | 1/2009 | Chiu et al. |
| 2009/0184334 A1 | 7/2009 | Lee et al. |
| 2010/0051986 A1 | 3/2010 | Min et al. |

FOREIGN PATENT DOCUMENTS

| EP | 1968124 A1 | 9/2008 |
| EP | 2056368 A1 | 5/2009 |
| WO | 2008/065373 A1 | 6/2008 |
| WO | WO 2010/146390 * | 12/2010 | .............. H01L 33/50 |

* cited by examiner

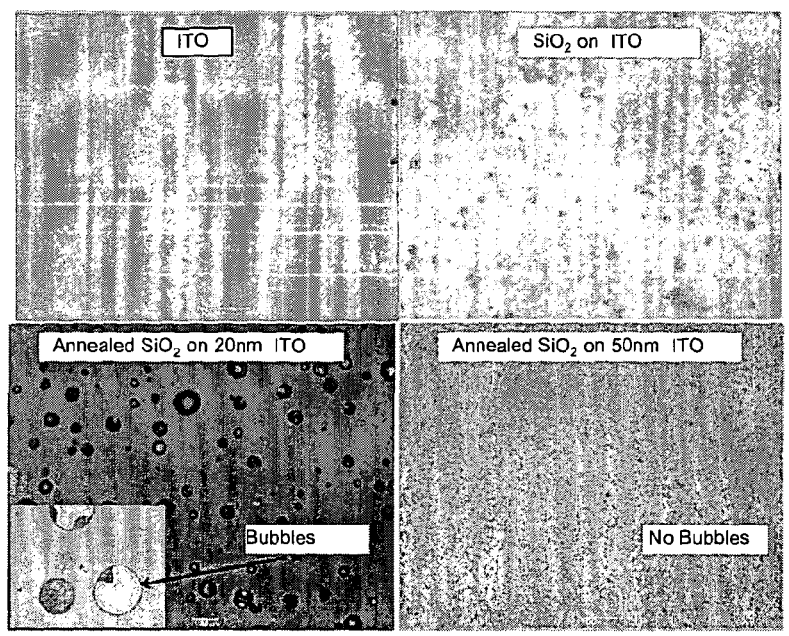
Fig. 4a  Fig. 4b
Fig. 4c  Fig. 4d

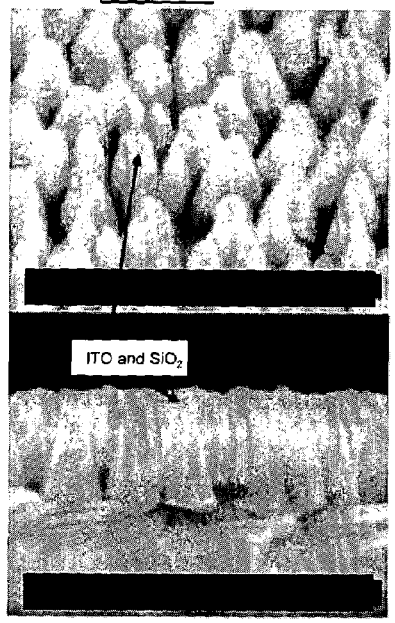
Fig. 5a
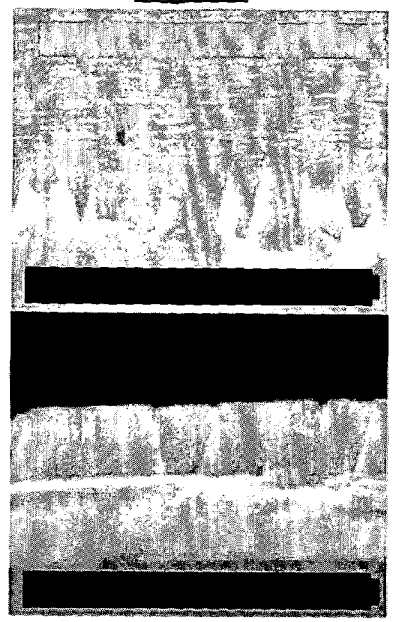
Fig. 5b
Fig. 5c
Fig. 5d
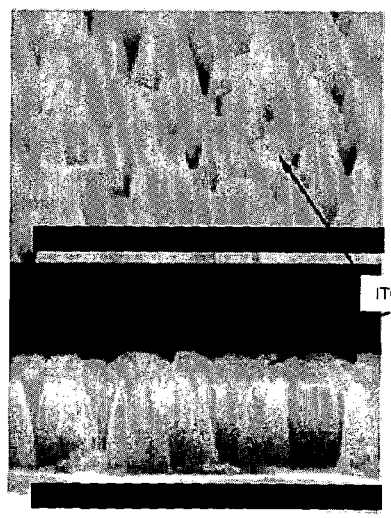
Fig. 6a  Before HNO$_3$ clean
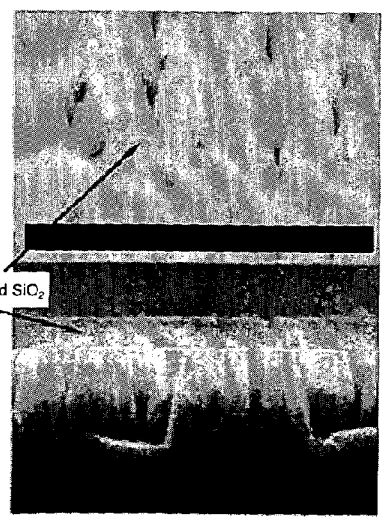
Fig. 6b  After HNO$_3$ clean
Fig. 6c
Fig. 6d

METHOD OF MANUFACTURING A LIGHT EMITTING DIODE

The invention relates to semiconductor devices and methods of making semiconductor devices. For example, the invention relates to light emitting diodes and methods of making the same, and in particular to increasing the optical performance of light emitting diodes comprising nano-rod arrays.

Semiconductor device fabrication usually involves etching, which can be wet etching or dry etching, whereby certain areas of a semiconductor wafer are removed. Typically this involves providing a mask over a wafer's upper layer, which covers part of the layer and exposes the areas that are to be removed. After the mask has been provided and used to control etching of the wafer, it is removed. However, the formation and removal of the mask can cause damage to the semiconductor layers of the wafer.

In the case of fabricating a light emitting diode (LED), for example, the wafer's upper layer will typically be a p-type (or n-type) semiconductor layer such as a layer of p-doped gallium nitride (p-GaN). It is known to form mask, for example of silicon dioxide ($SiO_2$) or silicon nitride over the p-GaN layer to control the etching of the p-GaN layer to form nano-rods. The materials used in the dry etching of the mask can cause severe degradation and 'deactivation' of the p-GaN layer, as can deposition of the mask layer on the p-GaN layer. Both of these processes can limit extraction efficiency and electrical properties, and consequently can limit the optical performance and reliability, of the resulting LED.

The invention provides a method of making a light emitting diode comprising the steps: providing a semiconductor wafer comprising a plurality of layers including a light emitting layer; providing a protective layer over the semiconductor wafer; and performing processing steps on the wafer to form the light emitting diode; wherein the protective layer is arranged to protect the semiconductor wafer during at least one of the processing steps.

The processing steps may include providing a mask over the protective layer. The mask may define masked and exposed areas. The processing steps may include shaping the semiconductor wafer in the exposed area. The protective layer may be arranged to protect the semiconductor wafer during at least part of the step of providing the mask.

The shaping of the semiconductor wafer will generally comprise etching, and the exposed areas may form etch areas that will be etched during the shaping step.

The step of providing the mask may comprise providing a mask layer over the protective layer and then etching through areas of the mask layer to form the mask. The protective layer may be arranged to protect the wafer during at least one of the providing of the mask layer and the etching of the mask layer.

Providing the mask may further comprise providing a metal layer over the mask layer. For example it may comprise providing a metal layer over said mask layer and annealing the metal layer to form metal islands which define the etch area between them.

The processing steps may include treating the etched semiconductor wafer with acid. The acid may be nitric acid, and may be at a temperature of at least 100 degrees Celcius. The duration of the acid treating step may be at least 1 minute. The acid may comprise an acid solution, for example at least 50% nitric acid.

The processing steps may include removing the mask.

The processing steps may include providing a contact layer over the etched semiconductor wafer. For example this may be a p-contact layer if the top layer of the wafer is a p-type layer, or it may be an n-contact layer if the top layer of the wafer is an n-type layer.

The protective layer may comprise a metal oxide, and preferably at least one of indium-tin oxide, zinc oxide and titanium oxide.

The protective layer is preferably no more than 100 nm thick, and more preferably no more than 50 nm thick, and still more preferably no more than 40 nm thick. The protective layer is preferably no less than 10 nm thick and more preferably no less than 20 nm thick, and most preferably no less than 30 nm thick.

Embodiments of the invention will now be described, by way of example only, with reference to the accompanying drawings in which:

FIGS. 1a, 1b and 1c show successive groups of steps of a method of fabricating a light emitting diode in accordance with the embodiment;

FIGS. 2a and 2b schematically show a semiconductor wafer suitable for fabricating a light emitting diode, to which the method steps of FIGS. 1a and 1b have been applied respectively;

FIG. 3 schematically shows a light emitting diode in accordance with the embodiment, which results from the method of FIGS. 1a-c;

FIGS. 4a-4d show an ITO protective layer and $SiO_2$ mask layer of an embodiment of the invention before and after annealing;

FIGS. 5a-5d show a semiconductor wafer before and after an acid curing step, where the protective ITO layer prepared is ~50 nm;

FIGS. 6a-6d show a semiconductor wafer before and after the acid curing step; where the protective ITO layer prepared is ~35 nm;

Figure 1A:
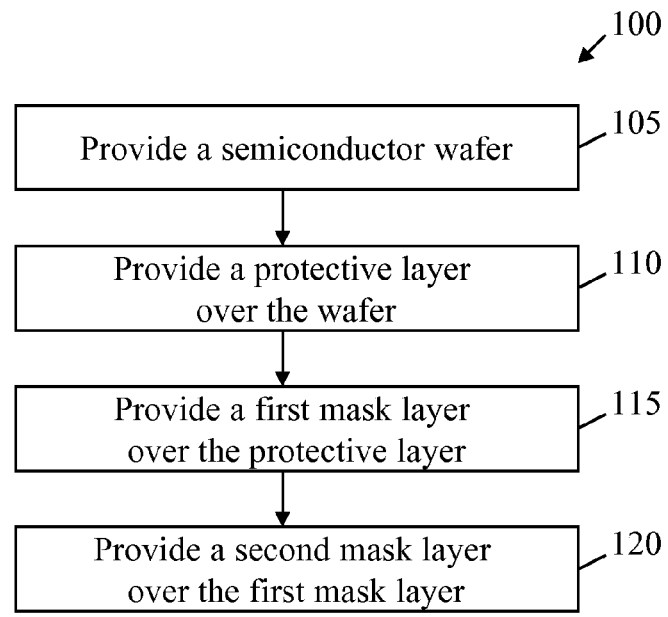
Figure 1B:
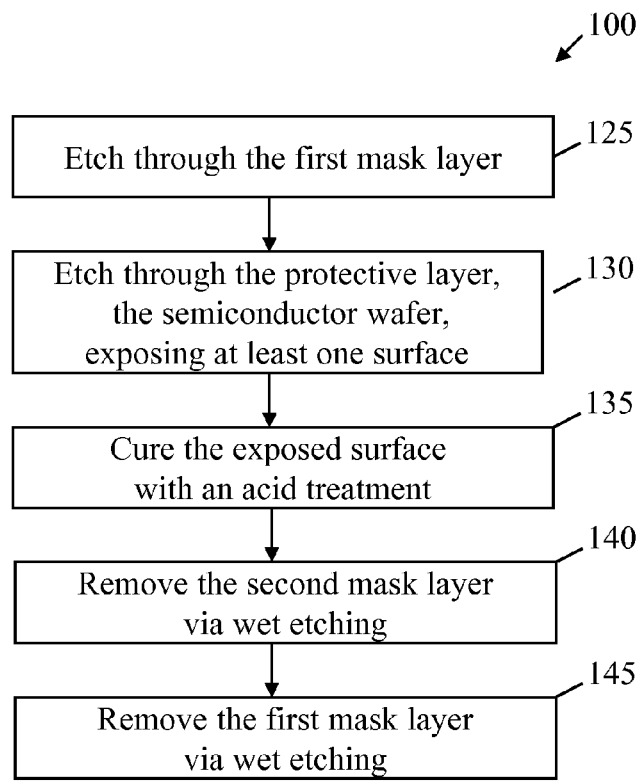
Figure 1C:
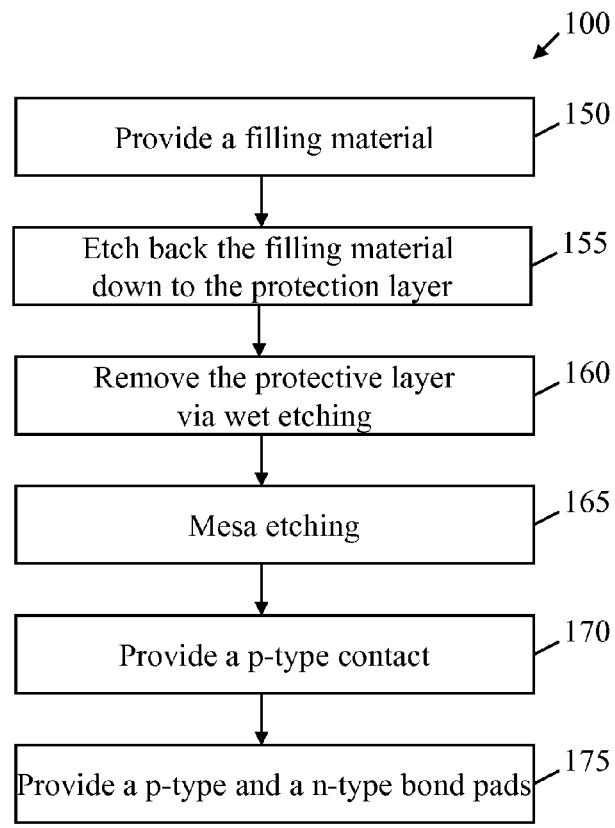
Figure 3:
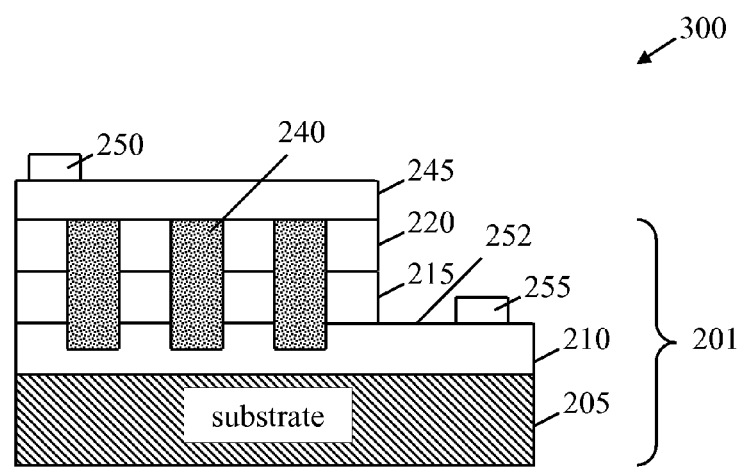

Referring to FIG. 3, in this embodiment a light emitting diode (LED) 300 is fabricated according to the method 100 shown in FIGS. 1a-1c.

Figure 2A:
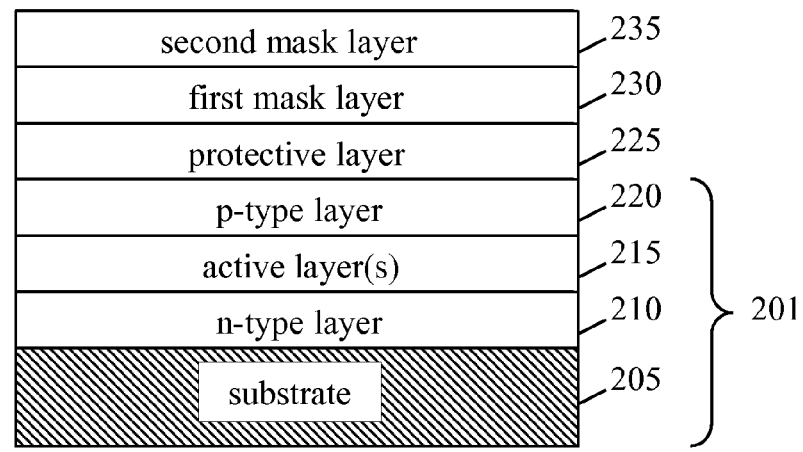

Referring to FIGS. 1a and 2a, the first step 105 of fabricating the LED 300 is providing a suitable semiconductor wafer 201. The wafer 201 is conventional and is made up of a substrate 205, which in this case comprises a layer of sapphire, over which is an n-type layer 210 formed of n-doped gallium nitride (n-GaN). Over the n-type layer 210 is an active layer 215, over which is a p-type layer 220 formed of p-doped gallium nitride (p-GaN). Other semiconductors, such as other Group III nitrides can be used in other embodiments.

The active layer 215 comprises multiple emitting layers (not shown). The emitting layers are formed of $In_xGa_{1-x}N$ which forms $In_xGa_{1-x}N$ quantum well (QW) layers and $In_yGa_{1-y}N$ which forms barrier layers (where x>y, and x or y from 0 to 1). These therefore provide multiple quantum wells within the emitting layers. Alternatively, the active layer 215 could comprise a single $In_zGa_{1-z}N$ layer (z from 0 to 1) which forms a single emitting layer.

A protective layer 225 is provided at step 110 over the p-type layer 220, using for example sputtering or electron beam evaporation or thermal evaporation. The protective layer 225 is formed of indium-tin oxide, and is deposited at an approximately uniform thickness of 35 nanometers. Providing an indium-tin oxide (ITO) protective layer 225 can protect the wafer 201 during subsequent processing steps, such as etching and deposition of further layers. It is important to provide a suitable thickness of the protective layer 225, as will be described below. Other materials including other metal oxides, especially zinc oxide and titanium oxide, can also be used for the protective layer.

A first mask layer 230 is provided at step 115 over the protective layer 225, for example using plasma-enhanced chemical vapour deposition (PECVD). The first mask layer 225 is formed of silicon dioxide, although there are suitable alternative materials for this layer e.g. silicon nitride, and is deposited at an approximately uniform thickness of 200 nanometers. The PECVD process uses $SiH_4$ and $N_2O$ and $O_2$ for deposition of $SiO_2$, $SiH_4$ and $NH_3$ for preparation of silicon nitride, and thus hydrogen ions are generated during this deposition process. As hydrogen ions tend to damage the p-GaN layer, the ITO protective layer protects the p-GaN layer during this deposition.

A second mask layer 235, comprising nickel, is provided over the first mask layer 230 225 at step 120. This can be by thermal evaporation or sputtering or electron beam evaporation. In this step 120, a nickel layer of approximately uniform thickness in the range 5 to 50 nanometers is formed and then annealed under flowing nitrogen ($N_2$), at a temperature in the range 600 to 900 degrees Celsius. The duration of the annealing process is between 1 and 10 minutes, resulting in formation from the nickel layer of a second mask layer 235 comprising self-assembled nickel islands distributed irregularly over the first mask layer 230. Each of the nickel islands covers a respective, approximately circular, area of the upper surface of first mask layer 230 which is, typically, no less than 100 nanometers in diameter and no more than 1000 nanometers in diameter. Thus the second mask layer 235 can act as a mask for etching the underlying $SiO_2$ layer, in which the nickel islands mask areas of the underlying $SiO_2$ layer and the spaces between the nickels islands leave exposed areas of the $SiO_2$ layer, defining which areas of the underlying $SiO_2$ layer will be etched.

Surprisingly, the inventors have found that providing the protective ITO layer 225 adversely affects the formation of the first mask layer 230 if the protective layer 225 is too thin. For example, if the protective layer 225 is a layer of indium-tin oxide which is 20 nanometers thick or less, annealing the second mask layer 230 causes the occurrence of bubble-like artefacts in the first mask layer 230. Accordingly, the protective layer 225 should be more than 20 nanometers thick if a further layer is to be provided over the first mask layer 230. This will be appreciated from FIGS. 4a to 4d. FIG. 4a shows the surface of the ITO layer, and FIG. 4b shows the surface of the $SiO_2$ layer deposited on the ITO layer. FIG. 4c, which shows bubble-like artefacts in the $SiO_2$ first mask layer 230 that have occurred during annealing when the protective ITO layer 225 is 20 nanometers thick. FIG. 4d shows that no bubble-like artefacts occur in the $SiO_2$ first mask layer 230 during annealing when the ITO protective layer 225 is 50 nanometers thick. Although the reasons for this effect are not fully understood, it is possible that a thin layer of ITO sets up strains in the $SiO_2$ layer due to the different structures of the ITO and $SiO_2$, but that those strains cease to be present when the ITO layer is thicker, for example because they cannot be supported.

Figure 2B:
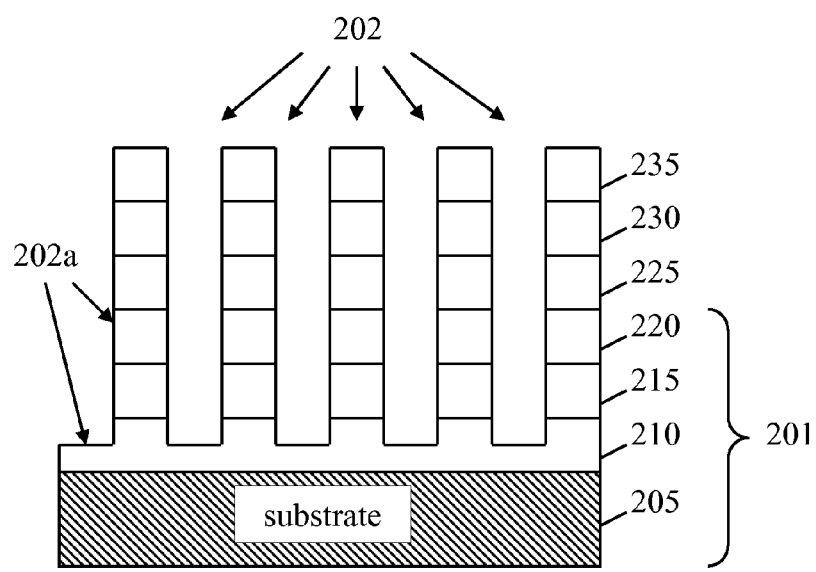

With reference to FIGS. 1b and 2b, the first mask layer 230 is etched through at step 125 using $CHF_3$ or $SF_6$ in a reactive ion etching (RIE) process using the second mask layer 235 as a mask. This step 125 provides nano-pillars (also referred to as nano-rods) 202 of silicon dioxide distributed irregularly over the protective layer 225, each comprising a respective part of the first mask layer 230 and a respective nickel island 235. Each nano-rod 202 corresponds to a respective nickel island, having a diameter that is approximately the same as the diameter of the surface area covered its respective nickel island. The ITO protective layer protects the p-layer during, and particularly at the end of, the etching of the first mask layer 230. This ensures that the etching can proceed right through the first mask layer, and the gases used in the RIE step will still not reach the p-layer, which is therefore protected from them. The nano-pillars 202 resulting from the previous step serve to mask some areas of the protective layer 225, and to define which areas (i.e. those exposed areas in the spaces between the nano-pillars 202) of the protective layer 225 will be etched.

At step 130 the protective layer 225 and the semiconductor wafer 201 is etched, for example by inductively coupled plasma etching, with the nano-pillars 202 that were formed in the previous steps used as a mask. This step 130 involves etching though the p-type layer 220, the active layer 215, and part way through the n-type layer 210, until the structure of FIG. 2b is achieved. The etching is monitored, for example using a 650 nm laser, until the desired depth is reached. This step 130 results in a nano-pillar structure, as shown in FIG. 2b, in which nano-pillars 202 extend upwards from the n-type layer 210, each nano-pillar 202 comprising a respective part of the n-type 210, active 215, p-type 220, protective 225, first mask 230 and second mask 235 layers. Therefore the etching at step 130 produces exposed surfaces 202a of the semiconductor wafer 201, which comprise the sides of the nano-pillars 202, throughout the layers above the n-type layer 210, and the upper surface of the n-type layer 210 between the nano-pillars 202. The diameter of each nano-pillar is approximately constant from top to bottom, being approximately the same as the diameter of the surface area covered by its respective nickel island, although in practice some tapering of the nano-pillars generally occurs.

At step 135 the etched semiconductor wafer 201 is exposed to an acid treatment. This step 135 involves bringing the exposed surfaces of the semiconductor wafer 201 into contact with nitric acid, at 70% concentration at 260° C., for 5 minutes. The entire semiconductor wafer 201 is immersed in the nitric acid, which cures the exposed surfaces 202a of the semiconductor wafer 201, including those of the emitting layers in the active layer 215, thereby enhancing the optical performance of the resulting LED 300.

The inventors have found that forming nano-pillars 202 in the semiconductor wafer 201 increases photo-luminescence in the LED 300, and that curing the nano-pillars 202 with nitric acid further increases the photo-luminescence of the LED 300 (but curing using other fluids, e.g. hydrochloric acid, has been found to decrease the photo-luminescence). However, the nitric acid treatment of step 135 has been found to cause the protective layer 225 to be eroded away if it is too thick, e.g. if the protective layer is 50 nanometers or more. That is, the nitric acid treatment at step 135 can remove the indium-tin oxide from the nano-pillars 202, thereby removing the silicon dioxide and nickel islands which are positioned on the tops of the nano-pillars, if the protective layer provided in step 110 is too thick. Accordingly, the protective layer 225 should be less than 50 nanometers thick if it is to be present for, and provide protection of the p-type layer 235 during, subsequent etching back of the loaded spin-on glass. This will be appreciated from FIGS. 5a-5d and FIGS. 6a-6d. FIGS. 5a and 5c show, from different perspectives, the nano-pillars 202 prior to the acid treatment at step 135, with an ITO layer of 50 nm thickness. FIGS. 5b and 5d show, from different perspectives, the nano-pillars 202 after that acid treatment, and it can be seen that this has removed the indium-tin oxide, the silicon dioxide and the nickel from the nano-pillars 202. FIGS. 6a-6d show corresponding views for an ITO layer of 20 nm. It can be seen from FIGS. 6b and 6d that the ITO layer and the mask layers remain on the pillars after the hot acid treatment.

At step 140 the second mask layer 235 is removed. This can be done by wet etching using hydrochloric acid (HCl) or nitric acid (HNO$_3$).

At step 145 the first mask layer 230 is removed. This can be performed by wet etching using hydrofluoric acid (HF). It is worth highlighting that this step can be arranged to leave the protective ITO layer so that it remains on the top of nano-rods. This is important because the remained protective ITO layer will protect the p-GaN from being damaged at the following etching-back step, i.e., step 155, as will be described below. Alternatively, this step can be combined with step 155 together, namely, the first mask layer 230 can be removed together with the filling material during the etching-back process at step 155.

Referring to FIG. 1c, at step 150 a filler layer, which in this embodiment comprises a mixture 240 of a support material (which could be an insulating transparent material or semi-insulating transparent material) and metal particles is provided in the space between the nano-pillars 202, in contact with the exposed surfaces 202a of the semiconductor wafer 201. Thus the support material supports the metal particles in that space. The mixture 240 fills the space and forms a layer from the n-type layer 210 up to and above the top of the nano-pillars 202. If the nano-pillars 202 are formed so that the maximum distance between adjacent nano-pillars 202 is, say, 200 nm then the maximum distance from any one of the metal particles to one of the exposed surfaces 202a is 100 nanometers. In which case, any metal particle that is coplanar with the active layer 215 is in a position which permits surface plasmon coupling. Moreover, the metal particles are suspended in the support material and distributed throughout it. Therefore, many of the particles will be positioned less than 100 nm (and for some particles, effectively zero nm) from a surface of one of the nano-pillars 202.

The support material in this case is a spin-on glass, but could be another polymer material or a phosphor; in addition, cadmium sulphide may be used but many suitable types of material will be apparent to those skilled in the art.

The metal particles are silver, but could be gold, nickel or aluminium, for example. The size of the metal particles is from a few nm to about 1 micron. The choice of metal is based on the wavelength, or frequency of light from the emitting layers of the active layer 215; for example silver is preferred for blue LEDs but aluminium is preferred for ultraviolet LEDs. The particle concentration in the support material is from 0.0001% w/w up to 10% w/w.

While the filler material in this embodiment is mainly arranged to support the metal particles to enhance surface plasmon coupling, in other embodiments other materials can form the filler material, such as wavelength conversion material which can be used in the manufacture of white LEDs.

At step 155 the filling material 240 is etched back. Step 155 is to etch the filling material 240 back to the protective layer on the top of the nano-rods. This can be done by using CHF$_3$ or/and SF$_6$ in a reactive ion etching (RIE) process. The gases CHF$_3$ or SF$_6$ can cause severe degradation and deactivation damage on p-type layer 220. Therefore, the protective layer 225 serves to ensure that the p-type layer 220 is not exposed to the etching gas CHF$_3$ or/and SF$_6$ during the etching-back process.

At step 160 the protective layer 225 is removed from the nano-pillars. This can be done by wet etching using hydrochloric acid (HCl) or nitric acid (the temperature of nitric acid can be up to 260° C.) in order to expose p-GaN 200 for the subsequent fabrication of p-contact, as will be described below The ITO protective layer is removed, since it tends to be damaged and can not form a good electrical contact. Acids such as HCl or nitric acid generally will not affect the remaining spin-on glass layer filling the gaps between the nano-pillars. However in some cases it might be possible for the ITO protective layer, or part of it, to be left on the top of the nano-pillar to form the electrical contact.

At step 165 a mesa 252 is etched as shown in FIG. 3 to expose parts of the surface of the n-type layer 210 that extends beyond the nano-pillars 202. This can be done by standard photolithography and inductively coupled plasma etching.

At step 170 a transparent p-contact layer 245, which can be ITO or another suitable metal, is provided over the p-type layer 220. Accordingly the p-contact layer 245 extends over the tops of the nano-pillars 202, in electrical contact with them, and over the mixture 240 of support material and metal particles that fills the space between the nano-pillars 202. Standard photolithography is used for deposition of the p-type contact.

At step 175 a p-contact pad 250 is formed on the p-contact layer 245, and an n-contact and n-pad 255 is formed on a flat upper surface of a portion 44 of the n-type layer 210 that extends beyond the nano-pillars 202, to produce the light emitting diode 300 shown in FIG. 3. Standard photolithography is used to produce said portion of the n-type layer 210.

Figure 7:
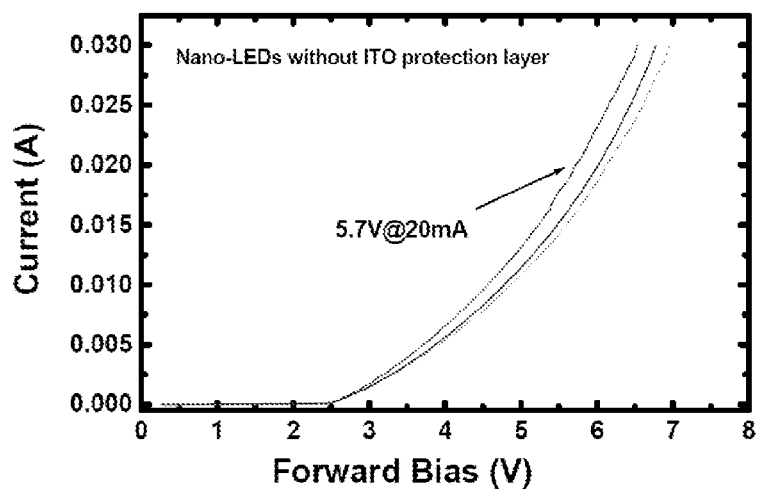
FIGS. 7 and 8 show the current Vs voltage characteristics of LEDs fabricated with and without ITO protective layers.
Figure 8:
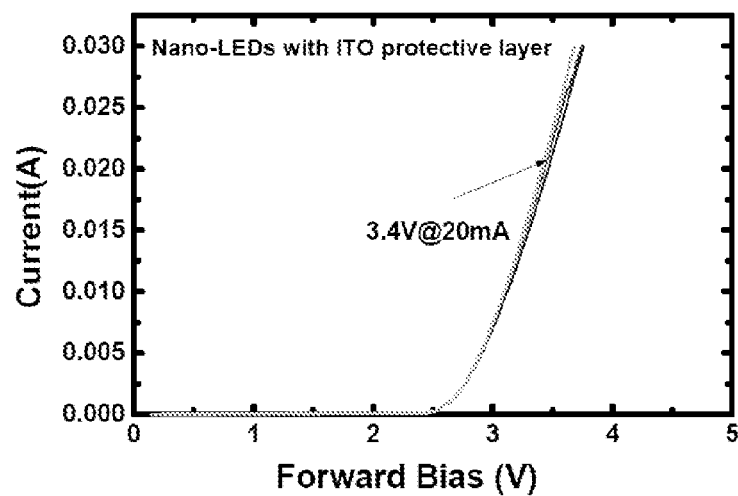

The benefits of the protective layer are shown in FIGS. 7 and 8. FIG. 7 shows the current characteristics of a group of devices formed with no protective layer, whereas FIG. 8 shows corresponding characteristics of a group of devices formed with an 35 nm ITO layer As can be seen, the devices with an ITO protective have significantly lower forward bias voltage for any given injection current, for example for a 20 mA injection current the forward bias for the device with ITO protective layer is 3.4V compared to 5.7V for the device without protective layer.

It will be appreciated that various modifications can be made to the embodiments described. For example it is possible for the device to be formed with the n-type semiconductor layer on top and the p-type layer at the bottom closest to the substrate. Also because the protective layer is effective in protecting the p-layer both during formation and etching of the mask layer, and during etching of the filler layer, it will be appreciated that other methods could be used for either the formation or the etching of the mask, or the etching back of the filler layer, and the protective layer would still provide some of the benefits described above. Also, while the curing step has significant benefits in this embodiment, in other embodiments it can be omitted or modified depending on the materials used in the wafer and for the etching steps.

The invention claimed is:

1. A method of making a light emitting diode comprising the steps:
   (i) providing a semiconductor wafer comprising a plurality of layers including a light emitting layer;
   (ii) providing a protective layer over the semiconductor wafer, the protective layer comprising at least one of indium-tin oxide, zinc oxide and titanium oxide;
   (iii) providing a mask layer over the protective layer, the mask layer comprising at least one of silicon dioxide and a silicon nitride layer;
   (iv) performing etching steps on the wafer to form the light emitting diode; wherein the protective layer is arranged to protect the semiconductor wafer during at least one of the etching steps.

2. A method according to claim 1 wherein the etching steps include etching through areas of the mask layer to form a mask.

3. A method according to claim 2 further comprising providing a metal layer over said mask layer and annealing the metal layer to form metal islands.

4. A method according to claim 2 wherein the mask defines an etch area and the etching steps include etching into the semiconductor wafer under the etch area.

5. A method according to claim 4 further comprising treating the etched semiconductor wafer with acid.

6. A method according to claim 5 wherein the acid is nitric acid at a temperature of at least 100 degrees Celsius.

7. A method according to claim 5 in which the duration of the treating step is at least 1 minute.

8. A method according to claim 5 in which the acid comprises at least 50% nitric acid.

9. A method according to claim 2 further comprising removing the mask.

10. A method according to claim 1 wherein the etching steps form nano-pillars in the wafer with gaps between them, and the method includes filling the gaps with material and etching back the material.

11. A method according to claim 1 further comprising removing the protective layer.

12. A method according to claim 1 further comprising providing a contact layer over the semiconductor wafer.

13. A method of making a light emitting diode comprising the steps:
   (i) providing a semiconductor wafer comprising a plurality of layers including a light emitting layer;
   (ii) providing a protective layer over the semiconductor wafer;
   (iii) performing processing steps on the wafer to form the light emitting diode; wherein the protective layer is arranged to protect the semiconductor wafer during at least one of the processing steps, and wherein the protective layer is no more than 50 nanometers thick.

14. A method according to claim 13 in which the protective layer is no less than 20 nanometers thick.

* * * * *